(12) United States Patent
Wang et al.

(10) Patent No.: US 10,946,961 B2
(45) Date of Patent: Mar. 16, 2021

(54) UNMANNED AERIAL VEHICLE

(71) Applicant: SZ DJI TECHNOLOGY CO., LTD., Shenzhen (CN)

(72) Inventors: Wei Wang, Shenzhen (CN); Jiangang Feng, Shenzhen (CN)

(73) Assignee: SZ DJI TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/715,356

(22) Filed: Dec. 16, 2019

(65) Prior Publication Data

US 2020/0140084 A1 May 7, 2020

Related U.S. Application Data

(63) Continuation of application No. PCT/CN2017/090165, filed on Jun. 27, 2017.

(51) Int. Cl.
 G01C 21/16 (2006.01)
 B64C 39/02 (2006.01)
 B64D 47/08 (2006.01)
 H05K 1/18 (2006.01)

(52) U.S. Cl.
 CPC ............ B64C 39/024 (2013.01); B64D 47/08 (2013.01); G01C 21/16 (2013.01); H05K 1/18 (2013.01); *B64C 2201/027* (2013.01); *B64C 2201/127* (2013.01); *H05K 2201/10151* (2013.01); *H05K 2201/10378* (2013.01); *H05K 2201/10598* (2013.01); *H05K 2201/10606* (2013.01)

(58) Field of Classification Search
 CPC ...... B64C 39/024; B64D 47/08; G01C 21/16; H05K 1/18
 See application file for complete search history.

(56) References Cited

U.S. PATENT DOCUMENTS

| 10,191,080 | B2* | 1/2019 | Quadrat ................ B64C 39/024 |
| 2016/0130015 | A1* | 5/2016 | Caubel .................. B64C 27/001 |
| | | | 244/120 |
| 2018/0246135 | A1* | 8/2018 | Pan ........................ G01C 21/16 |
| 2019/0056228 | A1* | 2/2019 | Chen ....................... G01P 15/14 |
| 2019/0391465 | A1* | 12/2019 | Li .......................... H04N 5/2254 |
| 2020/0132644 | A1* | 4/2020 | Micalizzi ................ H04L 67/12 |
| 2020/0230495 | A1* | 7/2020 | Tseng ..................... A63F 13/218 |

FOREIGN PATENT DOCUMENTS

| CN | 204383757 U | 6/2015 |
| CN | 204594467 U | 8/2015 |
| CN | 205022920 U | 2/2016 |

(Continued)

OTHER PUBLICATIONS

The World Intellectual Property Organization (WIPO) International Search Report for PCT/CN2017/090165 dated Mar. 28, 2018 6 pages.

*Primary Examiner* — Jamel E Williams
(74) *Attorney, Agent, or Firm* — Anova Law Group, PLLC

(57) ABSTRACT

The present disclosure provides an unmanned aerial vehicle (UAV). The UAV includes a main body; an inertial measurement unit (IMU) disposed in the main body; a mounting bracket for fixing the IMU; and a circuit board fixedly disposed at the main body and integrated with a plurality of functional modules. The IMU is fixed on the circuit board through the mounting bracket.

19 Claims, 3 Drawing Sheets

(56) References Cited

FOREIGN PATENT DOCUMENTS

| | | | |
|---|---|---|---|
| CN | 105509741 | A | 4/2016 |
| CN | 205652380 | U | 10/2016 |
| CN | 106257371 | A | 12/2016 |
| JP | 2008203072 | A * | 9/2008 |
| JP | 2008203072 | A | 9/2008 |

* cited by examiner

UNMANNED AERIAL VEHICLE

CROSS-REFERENCE TO RELATED APPLICATION

This application is a continuation application of International Application No. PCT/CN2017/090165, filed on Jun. 27, 2017, the entire content of which is incorporated herein by reference.

TECHNICAL FIELD

The present disclosure relates to the field of aircraft, and more specifically, to an unmanned aerial vehicle (UAV).

BACKGROUND

Inertial measurement unit (IMU) is an important component for measuring the attitude of a UAV. As such, the IMU needs to be securely mounted on the UAV to improve the reliability of the attitude measurement of the UAV.

Often, the IMU of most UAVs is fixed inside the housing of the UAV through a mounting bracket. As such, it is necessary to separately design a space inside the housing to fix the mounting bracket, thereby fixing the IMU. However, since the space inside the housing is generally occupied by the printed circuit boards (PCB) of various functional modules, the installation of the IMU may be challenging as the fixing method described above may need to occupy more space, which is not ideal for the miniaturization of the UAV.

SUMMARY

The present disclosure provides an unmanned aerial vehicle (UAV). The UAV includes a main body; an inertial measurement unit (IMU) disposed in the main body; a mounting bracket for fixing the IMU; and a circuit board fixedly disposed at the main body and integrated with a plurality of functional modules. The IMU is fixed on the circuit board through the mounting bracket.

In some embodiments, the circuit board includes a mounting portion, and the mounting bracket is connected to the mounting portion.

In some embodiments, the UAV further includes: a fastener, and the mounting bracket is connected to the mounting portion through the fastener.

In some embodiments, the mounting portion includes a nut, and the fastener is a screw that couples with the nut.

In some embodiments, the circuit board includes a mounting hole for mounting the nut.

In some embodiments, the nut passes through the mounting hole and is soldered to the circuit board.

In some embodiments, the nut is soldered to the circuit board by one or more of a reflow soldering, a wave soldering, and a manual soldering.

In some embodiments, the nut is a plate nut, and the nut includes an insertion portion and a stopper portion; and after the insertion portion is inserted into the mounting hole, the stopper portions covers the mounting hole to restrict movement of the nut in a direction of insertion.

In some embodiments, the nut is made of copper or a metal material with a copper-plated surface.

In some embodiments, two or more nuts are included in the mounting portion.

In some embodiments, three nuts are included in the mounting portion and distributed in a triangular shape on the circuit board.

In some embodiments, the mounting bracket includes a positioning member that couples with the mounting portion for positioning the mounting bracket to the circuit board.

In some embodiments, the positioning member includes a through hole for arranging the mounting portion to position the mounting bracket to the circuit board.

In some embodiments, the positioning member is integral with the mounting bracket.

In some embodiments, the functional modules are configured to control an operating state of the UAV and collect data.

In some embodiments, the data include one or more of: image data acquired by an image acquisition device disposed on the UAV, position data of the UAV, and power data of the UAV.

In some embodiments, the IMU is fixed on the circuit board, and electrically connected to the circuit board.

In embodiments of the present disclosure, the IMU is fixed on the circuit board through the mounting bracket. As such, the IMU does not need to have a separate space and mounting bracket inside the main body of the UAV. Accordingly, embodiments of the present disclosure make the interior of the main body more compact, saving space and facilitating the miniaturized design of the UAV. Further, the integration of multiple functions on the same circuit board makes the structure more compact, thus saving more space. In embodiments of the present disclosure, the UAV designs progress further towards miniaturization.

BRIEF DESCRIPTION OF THE DRAWINGS

In order to illustrate the technical solutions in accordance with the embodiments of the present disclosure more clearly, the accompanying drawings to be used for describing the embodiments are introduced briefly in the following. It is apparent that the accompanying drawings in the following description are only some embodiments of the present disclosure. Persons of ordinary skill in the art can obtain other accompanying drawings in accordance with the accompanying drawings without any creative efforts.

DESCRIPTION OF THE REFERENCE NUMERALS

Figure 1:
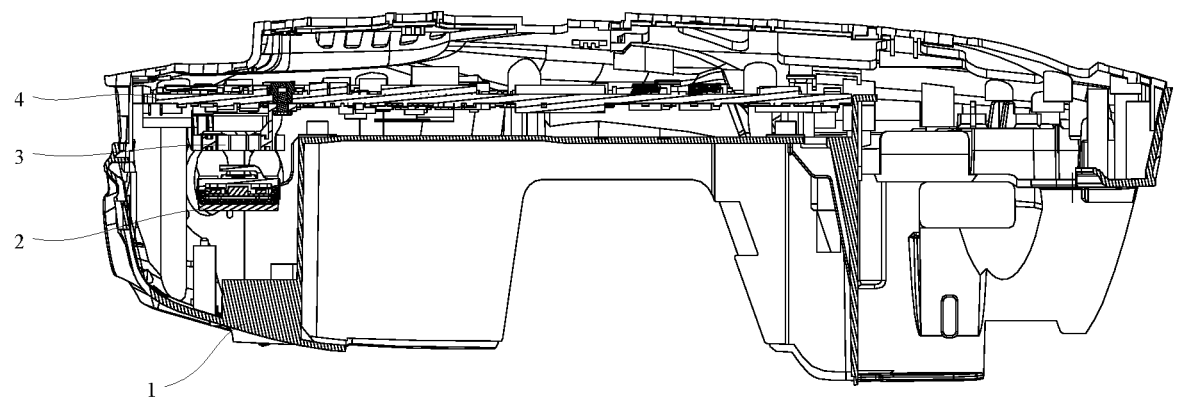
FIG. 1 is a structural view of a UAV according to an embodiment of the present disclosure.

1 Main body
2 IMU
3 Mounting bracket
4 Circuit board
41 Mounting hole
5 Mounting portion
51 Insertion portion 52 Stopper portion
6 Fastener
7 Positioning member

DETAILED DESCRIPTION OF THE EMBODIMENTS

The technical solutions provided in the embodiments of the present disclosure will be described below with reference to the drawings. However, it should be understood that the following embodiments do not limit the disclosure. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

The UAV of the present disclosure will be described in detail with reference to the accompanying drawings. In the case of no conflict, the embodiments and the features thereof can be combined with each other.

Referring to FIG. 1, the present disclosure provides a UAV. The UAV includes a main body 1, an IMU 2, a mounting bracket 3, and a circuit board 4. The IMU 2, the mounting bracket 3, and the circuit board 4 may be disposed at the main body 1. More specifically, the main body 1 may include a receiving space for receiving the IMU 2, the mounting bracket 3, and the circuit board 4. It is understood that the IMU 2, the mounting bracket 3, and the circuit board 4 may be disposed on, in, partially in, or under the main body 1. In some embodiments, the IMU 2, the mounting bracket 3, and the circuit board 4 may be disposed in the main body 1.

Figure 2:
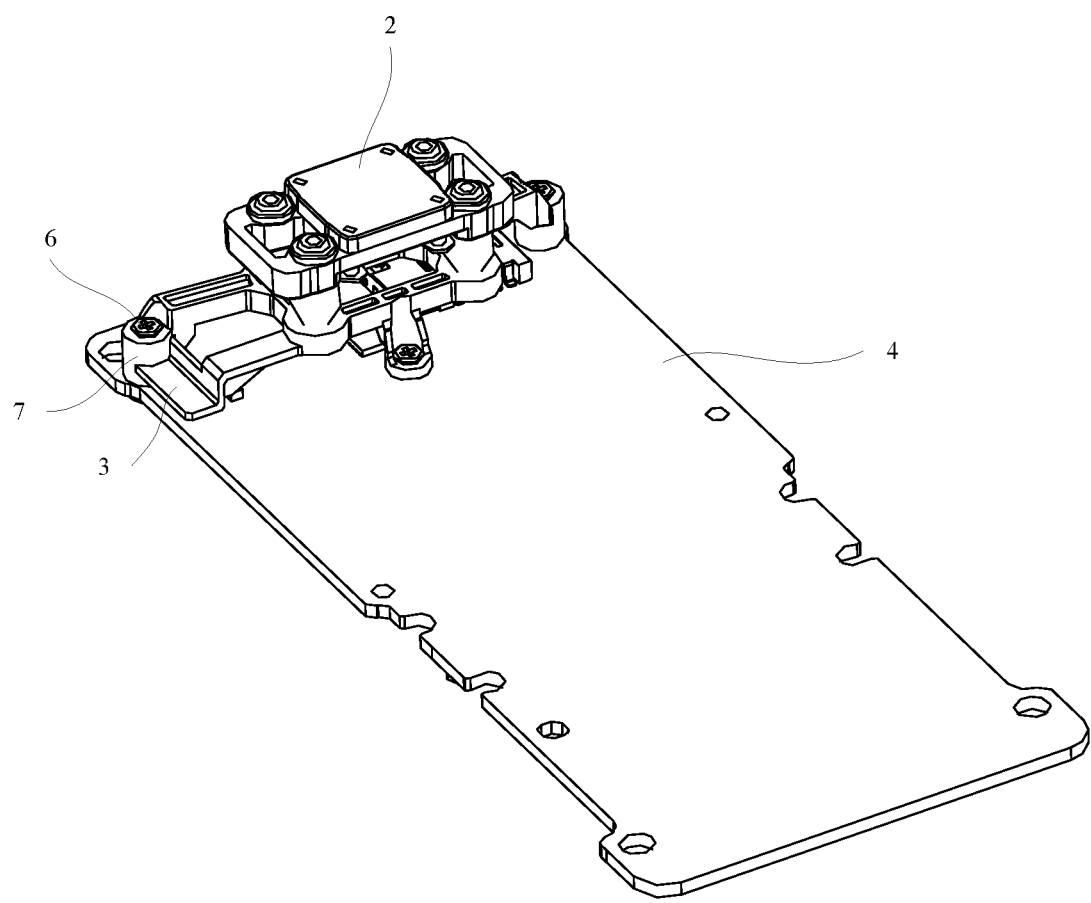
FIG. 2 is a perspective view illustrating a partial structure of the UAV according to an embodiment of the present disclosure.

Referring to FIG. 2, the mounting bracket 3 may be used to fix the IMU 2, and the mounting bracket 3 may be mounted on the circuit board 4. That is, the IMU 2 may be mounted on the circuit board through the mounting bracket 3. By using the mounting bracket 4 to directly mount the mounting bracket 3 with the fixed IMU 2, it may not be necessary to separately provide a space for mounting the mounting bracket 3 inside the main body 1, thereby saving the use of space inside the main body 1, which may make the structure of the UAV more compact and beneficial to the miniaturization of the UAV. In some embodiments, the IMU 2 may be fixed to the mounting bracket 3 by means of snapping or bonding. In other embodiments, IMU 2 may be fixed to the mounting bracket 3 by means of threads or the like.

To further improve the use of space inside the main body 1, it may be possible to further miniaturize the UAV by integrating various functional modules with the circuit board 4. In some embodiments, the functional modules may be used to at least control the operating state of the UAV. More specifically, the operating state may include flight, return flight, photographing, etc. In some embodiments, the functional modules may be used to at least collect data information. More specifically, the data information may include at least one or more of image data information acquired by an imaging acquisition device on the UAV, position data information of the UAV, and power information of the UAV. Further, the data information may also include other data information such as a remote control signal transmitted by a remote controller of the UAV. In some embodiments, the functional modules may be used to at least control the operating state of the UAV and collect data information. Of course, the functional module may include other functions that control the operation of the UAV. By integrating the functions required for the operation of the AUV onto the circuit board 4, the structure of the UAV maybe more compact to effectively reduce the size of the UAV, thereby making the UAV more compact.

In addition, the circuit board may be fixed at the main body 1, such that the circuit board 4 may be stably disposed on the UAV. In some embodiments, the periphery of the circuit board may be fixed to the inner walls of the main body 1, for example, by means of snapping or screwing. In some embodiments, an adapter fixed to the inner walls of the main body 1 may be provided inside of the main body 1, and the circuit board 4 may be fixed to the inner walls of the main body 1 through the adapter.

In the embodiments of the present disclosure, the fixing of the IMU 2 may be implemented by fixing mounting bracket for fixing the IMU 2 on the circuit board 4 provided inside the main body 1. As such, it is not necessary to design an additional space inside the main body 1 to fix the mounting bracket 3 for fixing the IMU 2. Therefore, the structure inside the main body 1 may be more compact, thereby saving the space usage inside the main body 1, which may be beneficial to the miniaturization of the UAV. Further, various functional modules may be integrated on the same circuit board 4, thereby further saving space, such that the UAV may be further miniaturized.

In order for the IMU 2 to detect the attitude of the UAV more accurately, in the present embodiment, the IMU 2 may be hung on the circuit board 4. Using a propeller of the UAV as a reference, the IMU 2 may be mounted on the side of the circuit board 4 away from the propeller, such that the IMU 2 may be hung inside the UAV. In the present embodiment, the main body 1 may include an upper housing (not shown) and a lower housing (not shown). A receiving space may be formed by a space surrounded by the upper housing and the lower housing, and the IMU 2 may be positioned between the circuit board 4 and the lower housing.

Further, the IMU 2 may be electrically connected to the circuit board 4, such that the detected attitude data of the UAV may be transmitted to the circuit board 4, and the circuit board 4 may be configured to perform further processing and subsequent operations. In some embodiments, the IMU 2 may be electrically connected to the circuit board 4 via a flexible circuit board. In the present embodiment, one end of the flexible circuit board 4 may be bonded to the IMU 2, and the other end of the flexible circuit board may be electrically connected to the PCB on the circuit board 4.

In some embodiments, the mounting bracket 3 may be directly fixed to the circuit board 4 by snapping or bonding. For example, an insertion hole may be arranged on the circuit board 4. The mounting bracket 3 may include a protrusion that may cooperate with the insertion hole, thereby implementing a fixed connection between the mounting bracket 3 and the circuit 4, such that the IMU 2 may be fixed to the circuit board 4. It should be noted that the position of the insertion hole on the circuit board 4 may be arranged to avoid the position of the PCB on the circuit board 4, such that the PCB on the circuit board 4 may not be damaged and stop working normally.

Figure 3:
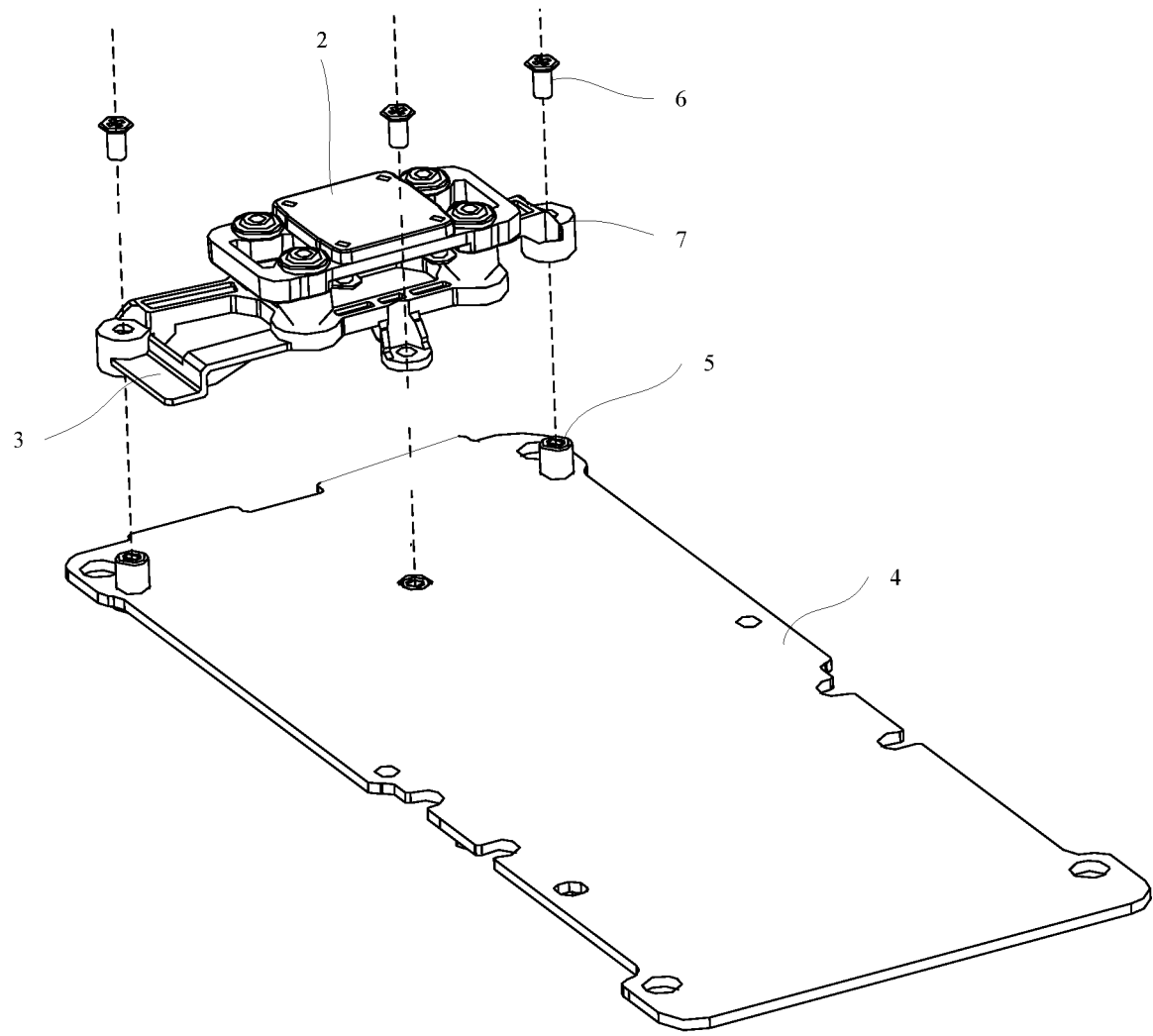
FIG. 3 is a view of an assembly of the partial structure of the UAV illustrating a positional relationship between a circuit board and a mounting bracket according to an embodiment of the present disclosure.
Figure 4:
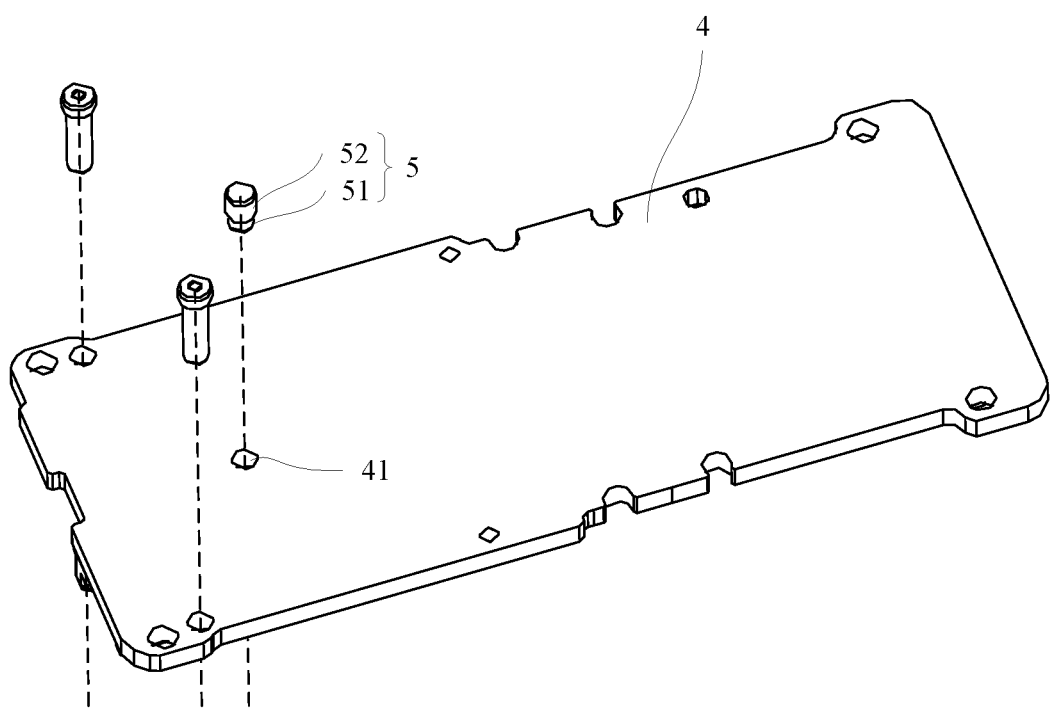
FIG. 4 is a view of the assembly of another partial structure of the UAV illustrating the positional relationship between the circuit board and a mounting part according to an embodiment of the present disclosure.
Figure 5:
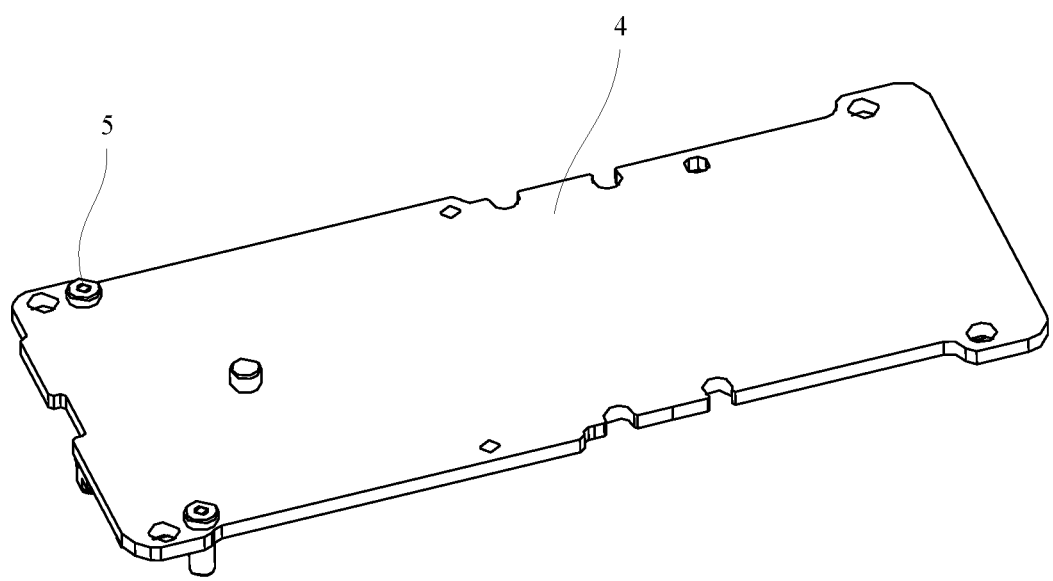
FIG. 5 is a perspective view illustrating another partial structure of the UAV according to an embodiment of the present disclosure.

In some embodiments, in conjunction with FIG. 3 to FIG. 5, in order to implement a fixed connection between the mounting bracket 3 and the circuit board 4, the circuit board 4 may include a mounting portion 5, and the mounting bracket 3 may be connected to the mounting portion 5. It should be noted that the position of the mounting portion 5 on the circuit board 4 may be arranged to avoid the position of the PCB on the circuit board 4, such that the PCB on the circuit board 4 may not be damaged and stop working normally.

In some embodiments, the mounting bracket 3 may be fixed to the mounting portion 5 by snapping or bonding. For example, the mounting portion 5 and the mounting bracket 3 may be snapped together by a protrusion-cavity manner. In some embodiments, referring to FIG. 3, in order to fix the mounting bracket 3 to the mounting portion 5 more stably, the UAV may further include a fastener 6, and the mounting bracket 3 may be connected to the mounting portion 5 via the fastener 6. In order to further ensure the connection between the mounting bracket 3 and the mounting portion 5, in the present embodiment, the mounting bracket 3 and mounting portion 5 may be connected via the fastener 6.

In some embodiments, the mounting portion 5 may be a nut, and the fastener 6 may be a screw that mates with the nut. Of course, in other embodiment, the mounting portion 5 and the fastener 6 may also be other structure that may interlock with each other. For example, the mounting portion 5 and the fastener 6 may be configured to be snap-fitting parts.

Referring to FIG. 4, in order to position the nut, such that the nut may be conveniently mounted on the circuit board 4, the circuit board 4 may include a mounting hole 41 for mounting the nut. In some embodiments, in order to further secure the nut to the circuit board 4, the nut may be passed through the mounting hole 41 and soldered to the circuit board 4. In some embodiments, the nut may be welded to the circuit board 4 by using at least one of a reflow soldering, a wave soldering, and a manual soldering. To facilitate the soldering and fixing of the nut to the circuit board 4, the nut may be made of copper or other metal materials with a copper-plated surface. Of course, the nut may also be made of other materials including a copper layer on the surface. For example, the core of the nut may be made of plastic, and the outer surface of the core may be covered by a copper layer, where the copper lay may be connected to the core by bonding. In some embodiments, to further secure the nut to the circuit board 4, an adhesive layer may be provided at the joint of the nut and the mounting hole 41.

In some embodiments, in conjunction with FIG. 3 and FIG. 4, the nut may be a plate nut that includes an insertion portion 51 and a stopper portion 52. After the insertion portion 51 is inserted into the mounting hole 41, the stopper portion 52 may cover the mounting hole 41 to restrict the movement of the nut relative to the insertion direction, thereby facilitating the mounting of the nut. Further, the insertion direction may be a direction in which the insertion portion 51 is inserted into the mounting hole 41.

In the present embodiment, the number of nuts may be set as needed. In order to fix the mounting bracket 3 more securely on the circuit board 4, at least two nuts may be needed, and the two nuts may be used to connect the mounting bracket 3 and the circuit board 4 in at least two locations. As such, the IMU 2 may be stably fixed on the circuit board 4, thereby preventing the measurement inaccuracy caused by the shaking of the IMU 2 during the flight of the UAV. In a specific implementation, three nuts may be used, and the three nuts may be distributed on the circuit board 4 in a triangular shape. As such, the structure is simple, and the IMU 2 may be relatively firmed fixed on the circuit board 4.

In conjunction with FIG. 2 and FIG. 3, a positioning member 7 may be arranged on the mounting bracket to cooperate with the mounting portion 5. The positioning member 7 may be used for positioning the mounting bracket 3 to the circuit board 4, such that the mounting bracket 3 may be conveniently and quickly fixed to the circuit board 4. In some embodiments, the positioning member 7 may include a through hole for arranging the mounting portion 5 to position the mounting bracket 3 to the circuit board 4. In the present embodiment, the number of the positioning members 7 may be the same as the number of the mounting portions 5, and the positioning members 7 and the mounting portions 5 may have a one-to-one correspondence.

A process of fixing the mounting bracket 3 to the circuit board 4 may be as follow. The positioning member 7 and the corresponding mounting portion 5 may be aligned, such that the positioning member 7 may pass through the mounting portion 5, and the positioning member 7 and the mounting portion 5 may be locked by the fastener 6. As it can be seen that after the positioning member 7 is positioned to the corresponding mounting portion 5, the positioning member 7 may be used to limit the movement of the corresponding mounting portion 5. As such, the mounting bracket 3 and the mounting portion 5 may not be movable in other directions other than the direction in which the positioning member 7 pass through the mounting portion 5. Further, the fastener 6 may be used to lock the positioning member 7 and the mounting portion 5, such that the mounting bracket 3 and the mounting portion 5 may be prevented from moving in the direction in which the positioning member 7 pass through the mounting portion 5. As such, the locking of the mounting bracket 3 and the mounting portion 5 may be achieved, thereby fixing the mounting bracket 3 to the circuit board.

In some embodiments, the positioning member 7 may be integrally formed with the mounting bracket 3. As such, the structure may be simple and the stability may be high. In other embodiments, the positioning member 7 may be a component that is independent of the mounting bracket 3. Further, the positioning member 7 may be fixed to the mounting bracket 3 by means of snapping, threading, or the like.

It should be noted that the relationship terms used in the text of this application, such as first and second, are only for distinguishing an object or operation from another object or operation, but not for defining or implying any practical relation or order between the object and operation. The terms "include", "contain" or other alternatives shall be non-exclusiveness, the inclusion of a series of element such as process, method, object or equipment shall include not only the already mentioned elements but also those elements not mentioned, and shall include the elements which are inherent in the process, method, object or equipment. However, under the condition of no more limitations, the definition of an essential element limited by the sentence "including a . . . " shall not obviate that in addition to containing the said essential element in the process, method, object or equipment, other essential element of the same nature may also exist in the above-mentioned process, method, object or equipment.

The UAV provided in embodiments of the present disclosure has been described in detail above. In the present disclosure, particular examples are used to explain the principle and embodiments of the present disclosure, and the above description of embodiments is merely intended to facilitate understanding the methods in the embodiments of the disclosure and concept thereof; meanwhile, it is apparent to persons skilled in the art that changes can be made to the particular implementation and application scope of the present disclosure based on the concept of the embodiments of the disclosure, in view of the above, the contents of the specification shall not be considered as a limitation to the present disclosure.

What is claimed is:

1. An unmanned aerial vehicle (UAV), comprising:
a main body;
an inertial measurement unit (IMU) disposed at the main body;
a mounting bracket for fixing the IMU; and
a circuit board fixedly disposed at the main body and integrated with a plurality of functional modules; wherein:
the IMU is fixed at the circuit board through the mounting bracket; and
both the IMU and the mounting bracket are disposed at a receiving space inside a lower portion of the main body, the receiving space being located in proximity to a side wall of the main body.

2. The UAV of claim 1, wherein the circuit board includes a mounting portion, and the mounting bracket is connected to the mounting portion.

3. The UAV of claim 2, further includes:
a fastener, and the mounting bracket is connected to the mounting portion through the fastener.

4. The UAV of claim 3, wherein the mounting portion includes a nut, and the fastener is a screw that couples with the nut.

5. The UAV of claim 4, wherein the circuit board includes a mounting hole for mounting the nut.

6. The UAV of claim 5, wherein the nut passes through the mounting hole and is soldered to the circuit board.

7. The UAV of claim 6, wherein the nut is soldered to the circuit board by one or more of a reflow soldering, a wave soldering, and a manual soldering.

8. The UAV of claim 4, wherein:
the nut is a plate nut, and the nut includes an insertion portion and a stopper portion; and
after the insertion portion is inserted into the mounting hole, the stopper portion covers the mounting hole to restrict movement of the nut in a direction of insertion.

9. The UAV of claim 4, wherein the nut is made of copper or a metal material with a copper-plated surface.

10. The UAV of claim 4, wherein two or more nuts are included in the mounting portion.

11. The UAV of claim 10, wherein three nuts are included in the mounting portion and distributed in a triangular shape on the circuit board.

12. The UAV of claim 2, wherein the mounting bracket includes a positioning member that couples with the mounting portion for positioning the mounting bracket to the circuit board.

13. The UAV of claim 12, wherein the positioning member includes a through hole for arranging the mounting portion to position the mounting bracket to the circuit board.

14. The UAV of claim 12, wherein the positioning member is integral with the mounting bracket.

15. The UAV of claim 1, wherein the functional modules are configured to control an operating state of the UAV and/or collect data.

16. The UAV of claim 15, wherein the data include one or more of: image data acquired by an image acquisition device disposed on the UAV, position data of the UAV, and power data of the UAV.

17. The UAV of claim 1, wherein the IMU is fixed on the circuit board, and electrically connected to the circuit board.

18. An unmanned aerial vehicle (UAV), comprising:
a main body;
an inertial measurement unit (IMU) disposed at the main body;
a mounting bracket for fixing the IMU;
a circuit board fixedly disposed at the main body and integrated with a plurality of functional modules; and
a fastener; wherein:
the IMU is fixed at the circuit board through the mounting bracket;
the circuit board includes a mounting portion, the mounting bracket being connected to the mounting portion through the fastener; and
the mounting portion includes a nut, and the fastener is a screw that couples with the nut.

19. An unmanned aerial vehicle (UAV), comprising:
a main body including an upper housing and a lower housing;
an inertial measurement unit (IMU) disposed at the main body;
a mounting bracket for fixing the IMU; and
a circuit board fixedly disposed at the main body and integrated with a plurality of functional modules; wherein:
the IMU is fixed at the circuit board through the mounting bracket; and
both the IMU and the mounting bracket are disposed between the circuit board and the lower housing.

* * * * *